United States Patent [19]
Tang

[11] Patent Number: 5,869,987
[45] Date of Patent: Feb. 9, 1999

[54] FAST RESPONSE COMPARATOR

[75] Inventor: Zhilong Tang, Allentown, Pa.

[73] Assignee: Lucent Technologies, Inc., Murray Hill, N.J.

[21] Appl. No.: 716,825

[22] Filed: Sep. 20, 1996

[51] Int. Cl.$^6$ .................................................. H03L 5/00
[52] U.S. Cl. ........................... 327/77; 327/307; 327/362
[58] Field of Search ................................ 327/307, 65, 77, 327/91–96, 336, 337, 554, 362; 330/9, 51

[56] References Cited

U.S. PATENT DOCUMENTS

| | | | |
|---|---|---|---|
| 4,429,282 | 1/1984 | Saari .................................................. | 330/9 |
| 4,633,223 | 12/1986 | Senderowicz ................................. | 330/9 |
| 4,808,942 | 2/1989 | Milkovic ......................................... | 330/9 |
| 5,410,270 | 4/1995 | Rybicki et al. ................................ | 330/9 |
| 5,506,526 | 4/1996 | Seesink ......................................... | 327/94 |
| 5,617,054 | 4/1997 | Koifman et al. ........................... | 327/337 |

OTHER PUBLICATIONS

G.M. Yin, F. Op't Eynde, and W. Sansen, "A High–Speed CMOS Comparator with 8–b Resolution", IEEE Journal of Solid–State Circuits, vol. 27 No. 2, Feb. 1992.

*Primary Examiner*—Toan Tran
*Attorney, Agent, or Firm*—Morgan & Finnegan, L.L.P.

[57] ABSTRACT

A comparator with output that responds quickly to changes in input. The comparator is made up of three stages, an input sampling network, a first amplifier stage, and a second amplifier stage. The input sampling network interfaces the two voltage levels that are to be compared with the first amplifier stage. The first amplifier stage then generates a low level signal that is dependent on the relative levels of the two inputs and passes the low level signal to the second amplifier stage. The second amplifier stage amplifies the output of the first amplifier stage to a usable level. Superior response time is achieved through by dividing the input sampling network into two stages, an input stage and an offset stage, and decoupling the two stages during offset cancellation.

22 Claims, 4 Drawing Sheets

FAST RESPONSE COMPARATOR

FIELD OF INVENTION

This invention relates to electronic signaling, and more particularly to the use of comparators for sampling electronic signals.

BACKGROUND OF THE INVENTION

Comparators are well known in the field of electronics. A typical comparator has two input terminals (a first input terminal and a second input terminal) and an output terminal. The voltages on the two input terminals are compared and the output depends on which of the two input voltages is greater. For example, if the input on the first terminal is larger than the input on the second terminal, the output is 2.5 volts (logic level 1); while if the input on the second terminal is greater than that on the first terminal, the output is −2.5 volts (logic level 0). The use of comparators is well known in the art of electronic signaling. For example, in the telecommunications industry, comparators are employed to recover signals that have been degraded by noise. FIGS. 1A, 1B and 1C are provided to illustrate how a data recovery process works. FIG. 1A shows a stream of digital data in the form of an ideal square wave with a peak to peak value of 5 volts. The square wave is used to represent data generated by a differential signaling digital source, such as a computer. The data may be transmitted to a digital receiver through any number of possible transmission media, such as copper wire, fiber optic lines, coaxial cable, or wireless links. Regardless of the media used, the data signal will be attenuated by the media and corrupted by noise as it travels to the receiver.

FIG. 1B shows the signal of FIG. 1A as it appears upon arrival at a receiver. For purposes of illustration, the received signal is modeled as a sine wave of period 2T, although in practice the received signal is likely to have a more irregular shape. To recover the original data from the received signal, one input terminal of a comparator is coupled to the received signal while the other input terminal of the comparator is coupled to a reference (e.g. 0 volts). The comparator then compares samples of the received signal to the reference. If a sample is greater than the reference, the output of the comparator is 2.5 volts (logic level 1), and if a sample is less than the reference, the output of the comparator is −2.5 volts (logic level 0). This sampling technique works best if the received signal is sampled at its peaks and valleys, since sampling at the peaks and valleys provides the greatest differential between the samples and the reference, and thus the greatest margin for error. However, the time of arrival of the signal is generally not known, and therefore sampling at the peaks and valleys can not be assured.

FIG. 1C illustrates the sampling of a received signal. As can be seen from the figure, a first sample 10 occurs just before the received waveform has crossed the 0 voltage point. The remaining samples occur regularly at periodic intervals following the first sample. Since the frequency of the original signal may be known a priori, the sampling frequency may be set to match the original frequency. Thus, once the first sample is adjusted such that it occurs at a peak or valley, the remaining samples will also occur at peaks or valleys. A method that is commonly used to find the peak and valley points of a received signal is to find the zero crossing point of the signal and then take the first sample at a point that is one quarter period removed from the zero crossing point.

Detection of the zero point may be accomplished through successive approximation. Upon taking of the first sample in FIG. 1C, the output of the comparator should be logic level 1 (2.5 volts) since the sample value is greater than the reference value of 0 volts. Normally, the second sample (1 period later) would again occur just before the received signal dipped below zero (sample 12). However, if the sampling time of the second sample were shifted right (sample 14), the second sample would occur just after the received waveform dipped below zero, and therefore the output of the comparator for the second sample would be −2.5 volts, thereby indicating that the zero crossing occurred some time between the time at which the unshifted second sample would have occurred and the time at which the second sample was actually taken. If the amount of shift is made small a zero crossing might not occur before the second sample. Accordingly, a small shift may be applied to successive samples until a zero crossing is detected; the smaller the shift, the more accurate the determination of the time of zero crossing.

The above-described zero crossing detection scheme is limited by the comparator's ability to respond to a zero crossing. The comparator output does not change instantaneously when the relative levels of the comparator inputs require that the output change. For example, when a comparator is comparing a received signal to a 0 volt reference and the received signal changes from a positive value (output is 2.5 volts) to a negative value (output should be −2.5 volts), the output does not change instantly to 2.5 volts. The received signal must be negative for some period of time (the "response time") before the comparator output changes from 2.5 volts to −2.5 volts. Therefore, the precision in detecting the time of zero crossing can only be as great as the response time of the comparator. Currently comparator response times are on the order of 4 ns.

SUMMARY OF THE INVENTION

It has been recognized that the slow response times of prior comparators may be attributable to driving amplifier stages deep into one output state just prior to the time that a change of output state is required, thereby creating an inertia of state that must be overcome in order to change state. This problem is addressed in the present invention by dividing the input sampling network into two stages, an input stage and an offset stage. Decoupling the two stages while the comparator performs offset cancellation prevents input signals from driving the amplifiers deep into an undesired output state.

In a typical embodiment the comparator is made up of three stages, an input sampling network, a first amplifier stage, and a second amplifier stage. The input sampling network interfaces the two voltage levels that are to be compared with the first amplifier stage. The first amplifier stage then generates a low level signal that is dependent on the relative levels of the two inputs and passes the low level signal to the second amplifier stage. The second amplifier stage amplifies the output of the first amplifier stage to a usable level.

DETAILED DESCRIPTION

The present invention is typically implemented in a single integrated circuit, however other embodiments are possible.

Figure 1A:
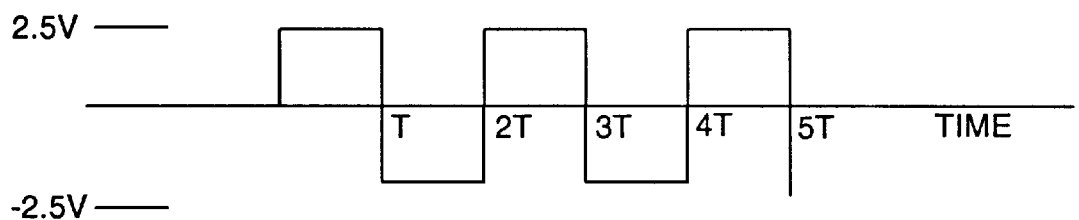
FIG. 1A is a signal diagram of a digital data transmission.
Figure 1B:
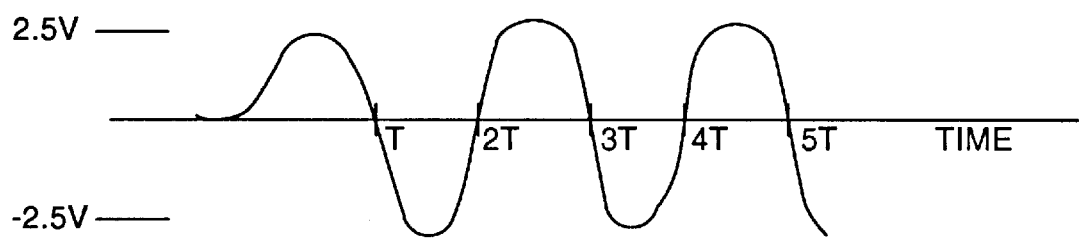
FIG. 1B is a signal diagram of digital data as it appears at a receiver.
Figure 1C:
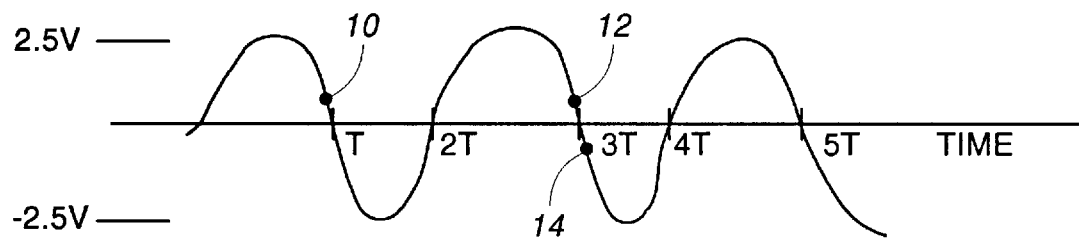
FIG. 1C is a signal diagram useful in illustrating the successive approximation technique of determining the zero crossing point of a received signal.
Figure 2:
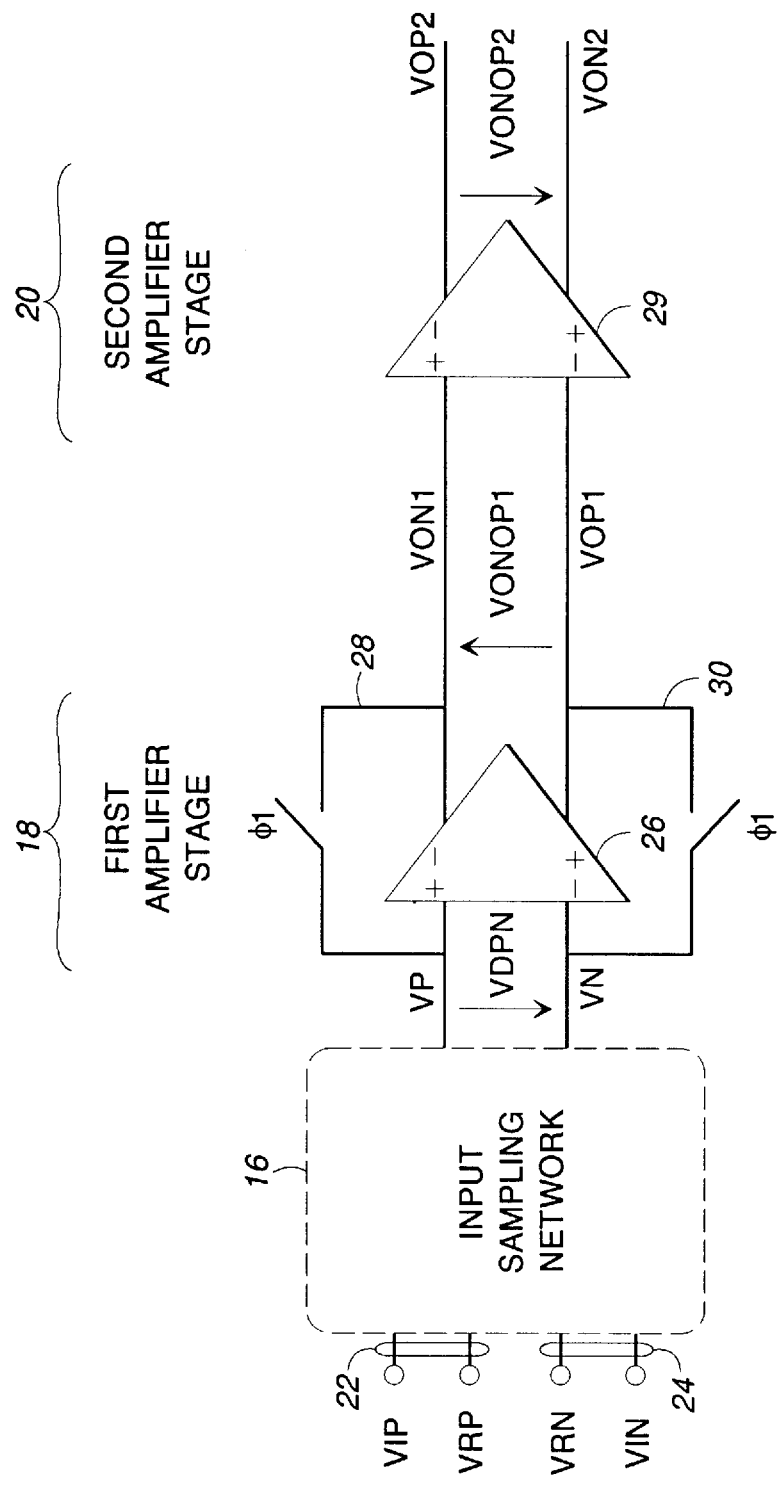
FIG. 2 is a block diagram of a comparator according to the present invention.

FIG. 2 is a block diagram of an embodiment of a comparator according to the present invention. The comparator is made up of three stages an input sampling network 16, a first amplifier stage 18, and a second amplifier stage 20. The input sampling network accepts two differential signal inputs, a first differential signal input through terminal pair 22, and a second differential signal input through terminal pair 24. The network passes the input signals to the first stage amplifier which includes an operational amplifier 26 and feedback loops 28 and 30. The operational amplifier 26 is used to generate a low level output signal based on a comparison of the inputs received from the sampling network, and to pass that low level output signal to an operational amplifier 29 in the second amplifier stage for amplification to a usable level. The feedback loops are used during offset cancellation (clock phase $\phi_1$). Both the input sampling network and the first amplifier stage are discussed in more detail below.

Figure 3:
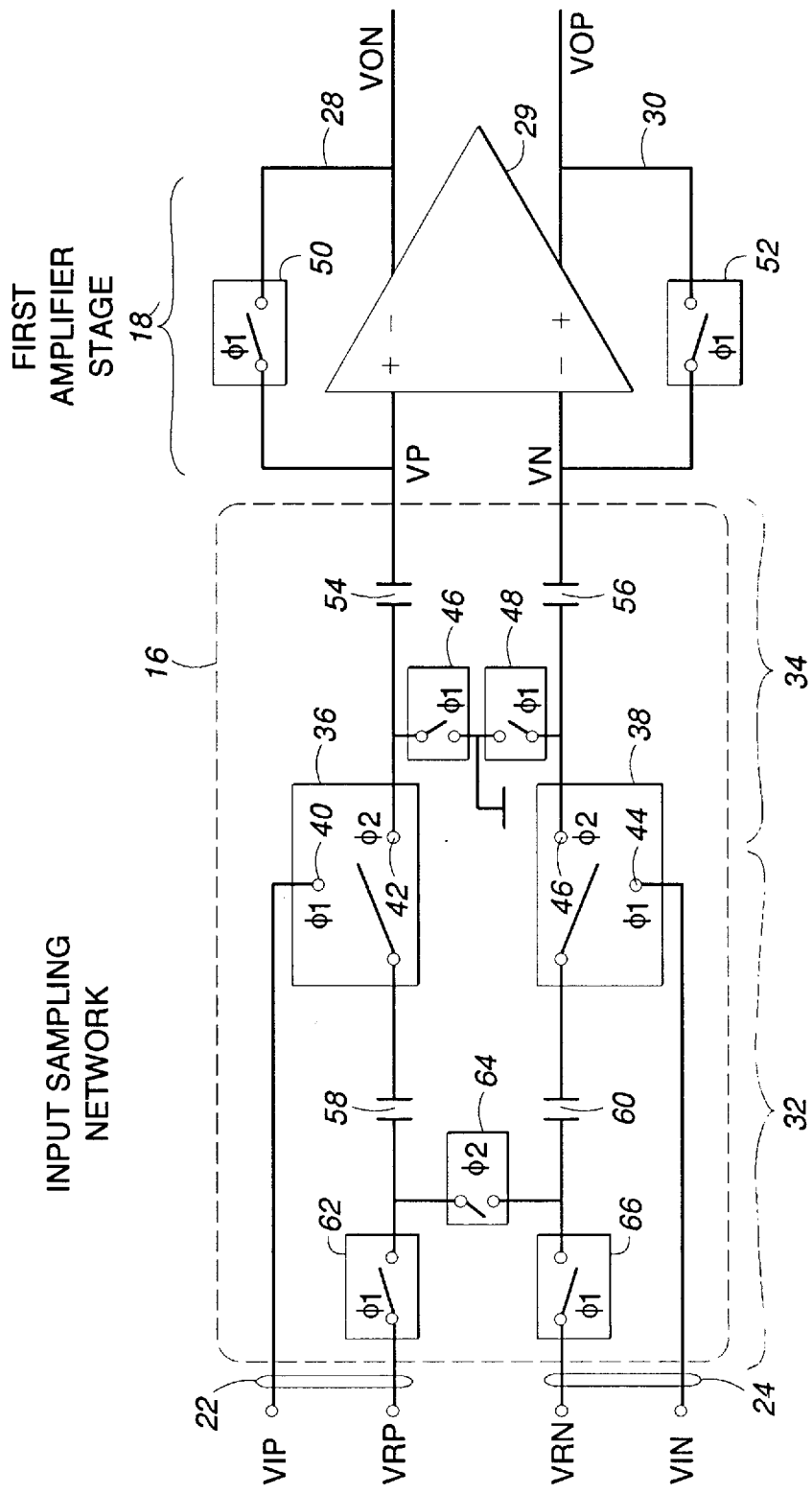
FIG. 3 is a schematic diagram of the input sampling network and first amplifier stage of a comparator according to the present invention.

FIG. 3 shows the input sampling network in greater detail. Also shown is the first amplifier stage. The symbols $\phi_1$ and $\phi_2$ refer to the two portions of the comparators clock cycle, offset cancellation ($\phi_1$) and input sampling ($\phi_2$). The symbols are used in the figure to denote switch positions. A label of $\phi_1$ next to a terminal indicates that the switch associated with the terminal contacts the terminal during the offset cancellation portion of the cycle and does not contact the terminal during the sampling portion. Similarly, a label of $\phi_2$ next to a terminal indicates that the switch associated with the terminal contacts the terminal during the sampling portion of the cycle and does not contact the terminal during the offset cancellation portion.

As can be seen from the figure, the input sampling network is made up of two parts an input stage 32 and an offset stage 34. The two stages are selectively coupled and decoupled through switches 36 and 38. During offset cancellation switch 36 is in the position denoted by terminal 40 and switch 38 is in the position denoted by terminal 44. At the same time, switches 46, 48, 50 and 52 are closed. Thus, during offset cancellation, operational amplifier 29 is configured as a voltage follower. Accordingly, any offset voltage that is present within amplifier 29 appears at the output of the amplifier. The voltage appearing at the output is fed back to the input via loops 28 and 30 and stored on capacitors 54 and 56. In this manner, the voltage necessary to cancel the amplifiers offset is stored on capacitors 54 and 56.

While the offset cancellation is being stored on capacitors 54 and 56, the input sample is being stored on capacitors 58 and 60. During offset cancellation switch 36 is in the terminal 40 position, switch 62 is closed, and switch 64 is open. Thus, the potential that is applied across terminals 22 (first input) is stored on capacitor 58. Similarly, switch 38 is in the terminal 44 position and switch 66 is closed, and the voltage across terminals 24 (second input) is stored on capacitor 60. Capacitors 58 and 60 track the inputs closely such that at any moment of time the voltage across the capacitors is equal to the instantaneous input voltages.

At the end of the offset cancellation phase the input stage and offset stage are coupled together. Switches 36 and 38 change position to terminals 42 and 46, respectively. Switch 64 closes and switches 62, 66, 46 and 48 open. Thereby, the sample voltages stored on capacitors 58 and 60 are added to the offset voltages stored on capacitors 54 and 56 and the totals are passed to the operational amplifier 29 for comparison. There is no feedback through loops 28 and 30 during the sample phase because switches 50 and 52 also open at the end of the offset cancellation phase.

It is important to note that the inputs to the comparator do not directly drive the first amplifier stage, and therefore do not drive the operational amplifier 29 deep into an undesired output state at a time when a rapid change of output state is required. During the sampling phase ($\phi_2$), the voltages stored on capacitors 58 and 54 drive the first input of the first amplifier stage. These voltages are constant throughout $\phi_2$ and they are respectively equal to the value of the input signal at terminal pair 22 at the beginning of $\phi_2$ and the value of the amplifier offset at the beginning of $\phi_2$. Similarly, during $\phi_2$, the voltages stored on capacitors 60 and 56 drive the second input of the first amplifier stage. These voltages are constant throughout $\phi_2$ and they are respectively equal to the value of a reference signal at terminal pair 24 at the beginning of $\phi_2$ and the value of the amplifier offset at the beginning of $\phi_2$. Thus, the input signal and reference do not drive the amplifier during $\phi_2$, but rather, the voltages stored on capacitors 54–60 drive the amplifier. Since the voltages on the capacitors is constant during $\phi_2$, they continuously drive the amplifier throughout $\phi_2$ to the desired output state for a sample taken at the beginning of $\phi_2$. Therefore, although the input signal and reference may vary during $\phi_2$, the variations will not cause the output of the amplifier to be driven away from the output value desired at the beginning of $\phi_2$.

The decoupling of the input signal from the amplifier is particularly important when the input signal is being sampled at a point where it "crosses" the reference. To illustrate, the case of a constant 0 volt reference and an input signal being sampled near the zero crossing is considered. If, for example, $\phi_2$ begins just before the zero crossing, the voltage on capacitor 58 would be positive throughout $\phi_2$ and would drive the output of the amplifier toward logic level 1. If, under the same circumstances, the input sampling network was not used (input signal coupled directly to the amplifier), then the output of the amplifier would be driven toward logic level 1 for a small portion of $\phi_2$ and driven toward logic level 0 (incorrect) for the remainder of $\phi_2$.

Figure 4:
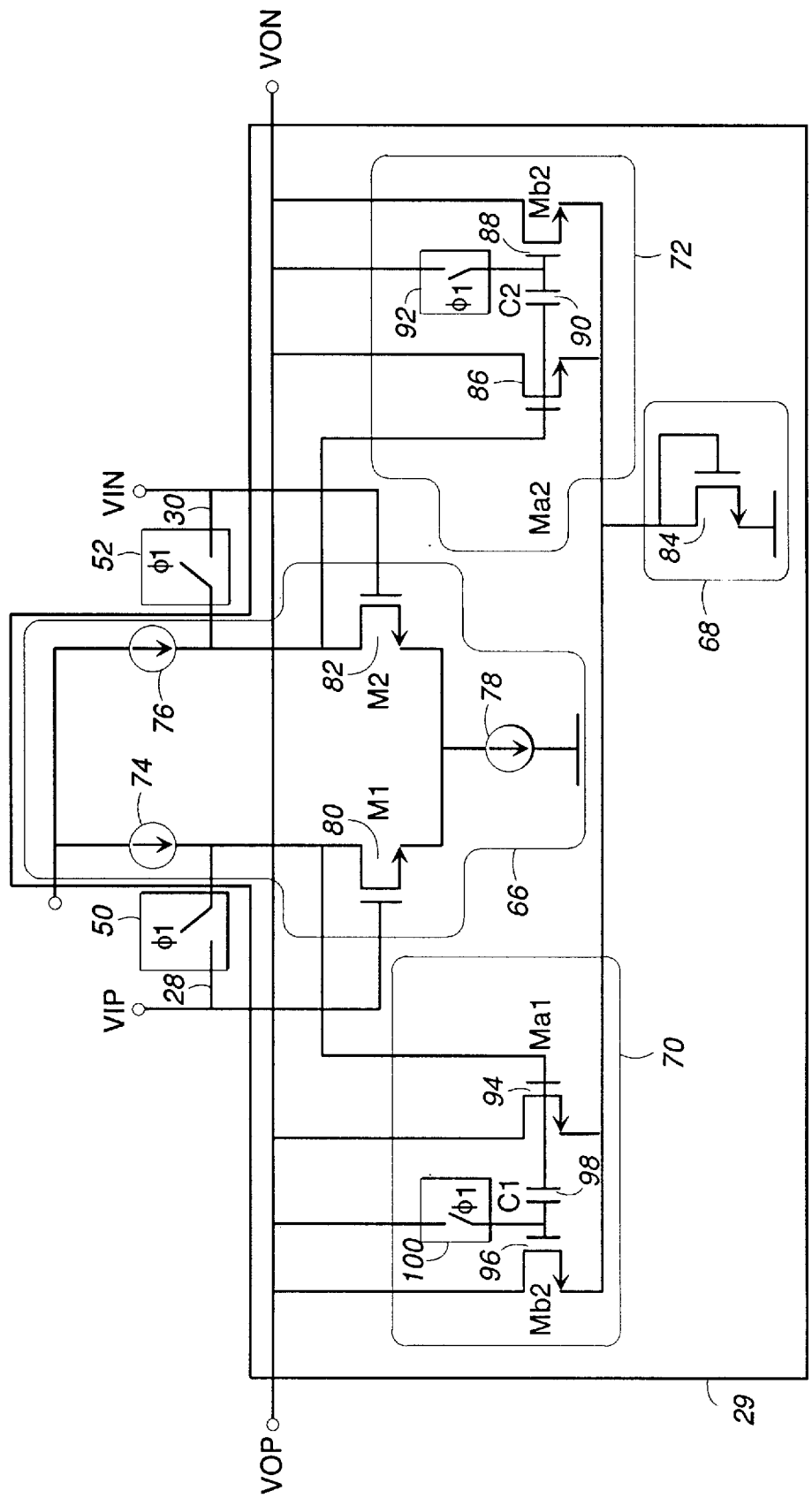
FIG. 4 is a circuit diagram of the first amplifier stage of a comparator according to the present invention.

FIG. 4 is a circuit diagram of a preferred embodiment of the first amplifier stage of a comparator according to the present invention. As described above, the amplifier stage includes operational amplifier 29, feedback loop 28 with switch 50, and feedback loop 30 with switch 52. The operational amplifier is made up of four sub-parts, a differential amplifier 66, a biasing circuit 68, a first output stage 70, and a second output stage 72. A standard differential amplifier circuit model is shown to represent the differential amplifier. It includes current sources 74, 76 and 78, and MOSFETs (Metal-Oxide Semiconductor Field-Effect Transistors) 80 and 82. Differential amplifiers are well known and there are many such amplifiers suitable for use with the invention. Similarly, biasing circuits are well known and many different types may be used with the invention. The biasing circuit shown in FIG. 4 is a MOSFET 84 having its gate and source coupled together and its drain coupled to ground. Output stages 70 and 72 are where the advantages of the amplifier stage of FIG. 4 are realized.

Output stage 72 includes a first MOSFET 86 and a second MOSFET 88, each having its source coupled to Von and its drain coupled to the biasing circuit. The gate of MOSFET 86 is coupled to Vop while the gate of MOSFET 88 is coupled to the gate of MOSFET 86 via capacitor 90. A switch 92 selectively couples the gate of MOSFET 88 to Von. Output stage 70 is similarly configured. It includes MOSFETS 94 and 96, capacitor 98 and switch 100. It should be noted that although the transistor elements of FIG. 4 are described as MOSFETS, many other transistor types may be used without departing from the spirit of the invention.

The amplifier of FIG. 4 must operate in two modes, offset cancellation and sampling. The output stages function to provide the desired results for both modes. A functional description of the output stages is provided below. Since the output stages are identical, a description of one stage sufficiently describes both of them, and therefore only output stage 72 will be described in detail.

During offset cancellation switch 92 is closed and the inputs to the gates of MOSFETS 86 and 88 are Vop and Von, respectively. Vop and Von are differential amplifier outputs, and are therefore equal in magnitude and opposite in polarity. Since MOSFETS 86 and 88 have their gates coupled to Vop and Von, yet have their sources and drains coupled together, they each cancel the effect of the other. That is, during offset cancellation, output stage 72 behaves as an open circuit. Furthermore, offset cancellation drives the amplifier stage towards a steady state, making capacitor 90 look like an open circuit and negating any effect that capacitor 90 might have on the cancelling MOSFETS. Thus, during offset cancellation, output stage 72 drops out of the circuit as desired.

In sampling mode switch 92 is open. The input to MOSFET 86 is Vop and the input to MOSFET 88 is also Vop. Although the gate of MOSFET 88 is coupled to Vop through capacitor 90, capacitor 90 looks like a short circuit during sampling mode and the coupling is effective. The reason capacitor 90 looks like a short circuit during sampling mode is that the differential amplifier outputs are changing rapidly to respond to the differential amplifier inputs. In particular, the rapid change of Vop makes it an AC signal that passes through capacitor 90. Thus, in sampling mode MOSFETS 86 and 88 work together to amplify the Vop output of the differential amplifier, providing a nominal amplification that is equal to twice that which could be provided by either MOSFET alone. Similarly, MOSFETS 94 and 96 work together to amplify the Von output of the differential amplifier. This dual amplification of differential amplifier outputs provides for rapid amplification of low level differential amplifier input signals, thereby allowing the differential amplifier to respond quickly to low level inputs and increasing the overall resolution of the comparator.

Several embodiments for the invention have been described in detail. However, it should be obvious that there are many further variations evident to persons skilled in the art. For example, the comparator may accept single ended signals rather than differential signals and may generate single ended output rather than differential output. The invention is more particularly defined in the appended claims.

I claim:

1. An integrated circuit including an input sampling network for correcting an original input signal and for supplying the corrected input signal to an operational amplifier, the input sampling network comprising:

a) a first storage element for storing an input signal value of said original input signal during a first operational portion of the amplifier;

b) a second storage element having a first terminal coupled to the first storage element and a second terminal coupled to a first input terminal of the operational amplifier, the second storage element for storing an offset value during said first operational portion; and c) means for coupling said first and second storage elements together during a second operational portion of the operational amplifier so that said offset value is added to said input signal value to yield an offset-corrected input signal value;

wherein said offset-corrected input signal value is coupled to the first input terminal of the operational amplifier and a reference signal is coupled to a second input terminal of the operational amplifier.

2. The invention of claim 1, wherein said first storage element comprises a capacitor.

3. The invention of claim 1, wherein said second storage element comprises a capacitor.

4. A comparator, comprising:

a) a first amplifier stage that includes an operational amplifier, said operational amplifier having at least a first input terminal and a second input terminal and at least one output terminal; and b) an input sampling network for correcting an original input signal and for supplying the corrected input signal to said first amplifier stage, said input sampling network including (i) a first storage element for storing an input signal value of said original input signal during a first operational portion of the comparator;

(ii) a second storage element having a first terminal coupled to the first storage element and a second terminal coupled to the first input terminal of the operational amplifier, the second storage element for storing an offset value during said first operational portion; and (iii) means for coupling said first and second storage elements together during a second operational portion of the comparator so that said offset value is added to said input signal value to yield an offset-corrected input signal value;

wherein said offset-corrected input signal value is coupled to said first input terminal of said operational amplifier and a reference signal is coupled to said second input terminal of said operational amplifier.

5. The invention of claim 4, wherein said first storage element of said input sampling network comprises a capacitor.

6. The invention of claim 4, wherein said second storage element of said input sampling network comprises a capacitor.

7. The invention of claim 4, further comprising a feedback loop coupling said output terminal of said operational amplifier to said first input terminal of said operational amplifier, said feedback loop including a switch for closing said feedback loop during said offset cancellation operation of said comparator and for opening said feedback loop during said sampling operation of said comparator.

8. The invention of claim 7, wherein said first storage element of said input sampling network comprises a capacitor.

9. The invention of claim 7, wherein said second storage element of said input sampling network comprises a capacitor.

10. The invention of claim 4, further comprising a second amplifier stage for amplifying the output of said first amplifier stage.

11. The invention of claim 10, wherein said first storage element of said input sampling network comprises a capacitor.

12. The invention of claim 10, wherein said second storage element of said input sampling network comprises a capacitor.

13. The invention of claim 10, further comprising a feedback loop coupling said output terminal of said operational amplifier to said first input terminal of said operational amplifier, said feedback loop including a switch for closing said feedback loop during said offset cancellation operation of said comparator and for opening said feedback loop during said sampling operation of said comparator.

14. The invention of claim 13, wherein said first storage element of said input sampling network comprises a capacitor.

15. The invention of claim 13, wherein said second storage element of said input sampling network comprises a capacitor.

16. The invention of claim 10, wherein said second amplifier stage comprises an operational amplifier other than the operational amplifier of said first amplifier stage.

17. The invention of claim 16, wherein said first storage element of said input sampling network comprises a capacitor.

18. The invention of claim 16, wherein said second storage element of said input sampling network comprises a capacitor.

19. The invention of claim 16, further comprising a feedback loop coupling said output terminal of said operational amplifier to said first input terminal of said operational amplifier, said feedback loop including a switch for closing said feedback loop during said offset cancellation operation of said comparator and for opening said feedback loop during said sampling operation of said comparator.

20. The invention of claim 19, wherein said first storage element of said input sampling network comprises a capacitor.

21. The invention of claim 19, wherein said second storage element of said input sampling network comprises a capacitor.

22. An integrated circuit comprising a comparator that includes:
  a) a first amplifier stage that includes an operational amplifier, said operational amplifier having at least a first input terminal and a second input terminal and at least one output terminal; and
  b) an input sampling network for correcting an original input signal and for supplying the corrected input signal to said first amplifier stage, said input sampling network including
    (i) a first storage element for storing an input signal value of said original input signal during a first operational portion of the comparator;
    (ii) a second storage element having a first terminal coupled to the first storage element and a second terminal coupled to the first input terminal of the operational amplifier, the second storage element for storing an offset value during said first operational portion; and
    (iii) means for coupling said first and second storage elements together during a second operational portion of the comparator so that said offset value is added to said input signal value to yield an offset-corrected input signal value;
  wherein said offset-corrected input signal value is coupled to said first input terminal of said operational amplifier and a reference signal is coupled to said second input terminal of said operational amplifier.

* * * * *